United States Patent
Nishimura et al.

(10) Patent No.: US 7,907,370 B2
(45) Date of Patent: Mar. 15, 2011

(54) TUNNELING MAGNETIC SENSING ELEMENT HAVING FREE LAYER CONTAINING COFE ALLOY

(75) Inventors: Kazumasa Nishimura, Niigata-ken (JP); Masamichi Saito, Niigata-ken (JP); Yosuke Ide, Niigata-ken (JP); Masahiko Ishizone, Niigata-ken (JP); Ryo Nakabayashi, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 758 days.

(21) Appl. No.: 11/851,570

(22) Filed: Sep. 7, 2007

(65) Prior Publication Data

US 2008/0074804 A1 Mar. 27, 2008

(30) Foreign Application Priority Data

Sep. 21, 2006 (JP) ................. 2006-255658

(51) Int. Cl.
*G11B 5/39* (2006.01)
(52) U.S. Cl. .................... 360/324.2
(58) Field of Classification Search ............ 360/324.2
See application file for complete search history.

(56) References Cited

U.S. PATENT DOCUMENTS

| 6,841,395 B2 * | 1/2005 | Linn et al. ............ 438/3 |
| 7,266,012 B2 * | 9/2007 | Saito et al. ............ 365/158 |
| 7,342,753 B2 * | 3/2008 | Gill ............ 360/324.12 |
| 7,349,187 B2 * | 3/2008 | Parkin ............ 360/324.2 |
| 7,443,639 B2 * | 10/2008 | Parkin ............ 360/324.2 |
| 7,534,626 B2 * | 5/2009 | Parkin ............ 438/3 |
| 7,595,520 B2 * | 9/2009 | Horng et al. ............ 257/295 |
| 2008/0023740 A1 * | 1/2008 | Horng et al. ............ 257/295 |
| 2008/0152834 A1 * | 6/2008 | Pinarbasi ............ 427/529 |
| 2009/0243007 A1 * | 10/2009 | Buttet et al. ............ 257/421 |
| 2009/0244960 A1 * | 10/2009 | Saito et al. ............ 365/158 |
| 2009/0325319 A1 * | 12/2009 | Horng et al. ............ 438/3 |

FOREIGN PATENT DOCUMENTS

| JP | 2004-179183 | 6/2004 |
| JP | 2004-179187 | 6/2004 |
| JP | 2005-050907 | 2/2005 |
| JP | 2005-116888 | 4/2005 |

\* cited by examiner

*Primary Examiner* — Mark Blouin
(74) *Attorney, Agent, or Firm* — Brinks Hofer Gilson & Lione

(57) ABSTRACT

A tunneling magnetic sensing element including an Mg—O insulating barrier which can maintain favorable soft-magnetic properties of a free magnetic layer and can have a high resistance change ratio ($\Delta R/R$) compared to known tunnel magnetic sensing elements is disclosed, and a method of manufacturing such a tunneling magnetic sensing element is also disclosed. An enhance layer (second magnetic layer) composed of $Co_{100-X}Fe_X$ having a Fe composition ratio X of about 30 to 100 at % is disposed on the Mg—O insulating barrier. With this, the magnetostriction $\lambda$ of the free magnetic layer can be reduced and the resistance change ratio ($\Delta R/R$) can be increased.

4 Claims, 7 Drawing Sheets

FIG. 4
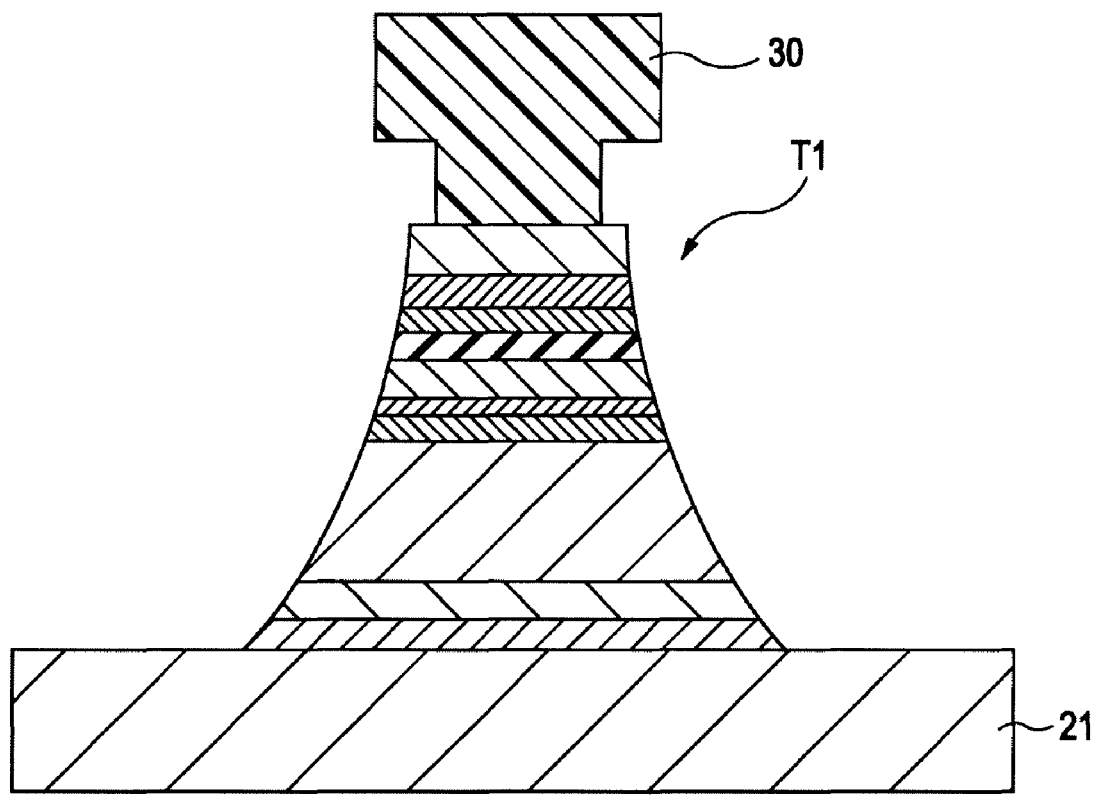
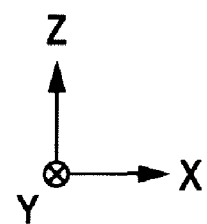

* THE NUMERALS IN THE GRAPH DENOTE Fe COMPOSITION RATIOS IN ENHANCE LAYERS.

TUNNELING MAGNETIC SENSING ELEMENT HAVING FREE LAYER CONTAINING COFE ALLOY

CLAIM OF PRIORITY

This application claims benefit of the Japanese Patent Application No. 2006-255658 filed on Sep. 21, 2006, which is hereby incorporated by reference.

BACKGROUND

1. Field of the Invention

The present invention relates to a tunneling magnetic sensing element, which is mounted on a hard disk or is used as an MRAM (Magnetic Random Access Memory), for example. More specifically, the present invention relates to a tunneling magnetic sensing element including an Mg—O insulating barrier. The element can increase a high resistance change ratio ($\Delta R/R$) while maintaining favorable soft-magnetic properties of a free magnetic layer. The present invention further relates to a method of manufacturing the tunneling magnetic sensing element.

2. Description of the Related Art

In tunneling magnetic sensing elements, a resistance change is generated by a tunnel effect. When the magnetization of a pinned magnetic layer and the magnetization of a free magnetic layer are in anti-parallel alignment, a tunnel current flowing in an insulating barrier (tunnel barrier) disposed between the pinned magnetic layer and the free magnetic layer is reduced, and the resistance value becomes the maximum. On the other hand, when the magnetization of the pinned magnetic layer and the magnetization of the free magnetic layer are in parallel alignment, the tunnel current flows most easily and the resistance value becomes the minimum.

By using this phenomenon, an electric resistance change caused by a variation in magnetization of the free magnetic layer which is caused by influence of external magnetic fields is detected as a voltage change, and a leakage magnetic field from a recording medium is detected.

The properties, such as a resistance change ratio ($\Delta R/R$), of a magnetic sensing element are varied by changing the material of an insulating barrier. Therefore, studies have been conducted for various materials used as insulating barriers.

The important properties of a tunneling magnetic sensing element are soft-magnetic properties such as resistance change ratio ($\Delta R/R$), RA (element resistance R×area A), and magnetostriction $\lambda$ and coercive force Hc of a free magnetic layer. These properties have been improved by optimizing materials and configuration of the insulating barrier, the pinned magnetic layer disposed on the top face of the insulating barrier, and the free magnetic layer disposed on the bottom face of the insulating barrier.

For example, in Patent Document 1, an insulating material used for an insulating barrier is disclosed in Japanese Unexamined Patent Application Publication No. 2004-179187 (refer to column [0036]). Related art configurations are disclosed in Japanese Unexamined Patent Application Publication No. 2004-179187, Japanese Unexamined Patent Application Publication No. 2005-50907, Japanese Unexamined Patent Application Publication No. 2005-116888, and Japanese Unexamined Patent Application Publication No. 2004-179183.

In the disclosure of above-mentioned Patent Documents, magnesium oxide (Mg—O) is used as the insulating barrier. In a tunneling magnetic sensing element having a lamination composed of, from the bottom, an antiferromagnetic layer, a pinned magnetic layer, an insulating barrier, and a free magnetic layer, a large resistance change ratio ($\Delta R/R$) can be obtained by forming the insulating barrier by Mg—O and the free magnetic layer by CoFeB.

However, the magnetostriction $\lambda$ of the free magnetic layer becomes large such as several tens ppm (for example, about 40 ppm as described below), which causes disadvantages the soft-magnetic properties of the free magnetic layer of deteriorate thereby, reducing the stability of reproducing characteristics.

The above-mentioned Patent Documents disclose not only materials for the insulating barrier but also materials for the pinned magnetic layer and the free magnetic layer (for example, Claim 1 of Japanese Unexamined Patent Application Publication No. 2004-179187 and column [0166] of Japanese Unexamined Patent Application Publication No. 2005-116888.

However, optimum materials and layer configuration of the pinned magnetic layer and the free magnetic layer when the insulating barrier is composed of Mg—O are not disclosed. No improvement in the structure (materials, composition ratio, and so on) of the free magnetic layer and the pinned magnetic layer has been conducted, in particular, in view of obtaining a high resistance change ratio ($\Delta R/R$) while maintaining favorable soft-magnetic properties of the free magnetic layer when the insulating barrier is composed of Mg—O.

SUMMARY

The tunneling magnetic sensing element according to the one aspect includes a first magnetic layer, an insulating barrier, and a second magnetic layer which are laminated in this order from the bottom. The first magnetic layer constitutes at least a part of a pinned magnetic layer having a pinned magnetization direction. The second magnetic layer constitutes at least a part of a free magnetic layer having a magnetization direction being changed by an external magnetic field. The insulating barrier is composed of Mg—O, and the second magnetic layer is composed of $Co_{100-X}Fe_X$ having a Fe composition ratio X of about 30 to 100 at %.

According to the present invention, the tunneling magnetic sensing element including the Mg—O insulating barrier can increase the resistance change ratio ($\Delta R/R$) while maintaining favorable soft-magnetic properties of the free magnetic layer, in particular, can decrease magnetostriction $\lambda$ which is conventionally perceived as a problem.

It is preferred that the insulating barrier has a body-centered cubic structure in which an equivalent crystal plane typically represented as a {100} plane is preferentially oriented in the direction parallel to the interface.

Furthermore, the present invention provides a method of manufacturing a tunneling magnetic sensing element including a first magnetic layer, an insulating barrier, and a second magnetic layer which are laminated in this order from the bottom, wherein the first magnetic layer constitutes at least a part of a pinned magnetic layer having a pinned magnetization direction, and the second magnetic layer constitutes at least a part of a free magnetic layer having a magnetization direction being changed by an external magnetic field. The method includes the steps of (a) forming an insulating barrier composed of Mg—O on the first magnetic layer, and (b) forming a second magnetic layer composed of $Co_{100-X}Fe_X$ having a Fe composition ratio X of about 30 to 100 at % on the insulating barrier.

BRIEF DESCRIPTION OF THE DRAWINGS

FIG. 4 a process drawing illustrating the step performed after the step shown in FIG. 3 (a cross-sectional view of the tunneling magnetic sensing element during the manufacturing process, taken in the direction parallel to the face opposing a recording medium);

DESCRIPTION OF THE EMBODIMENTS

Figure 1:
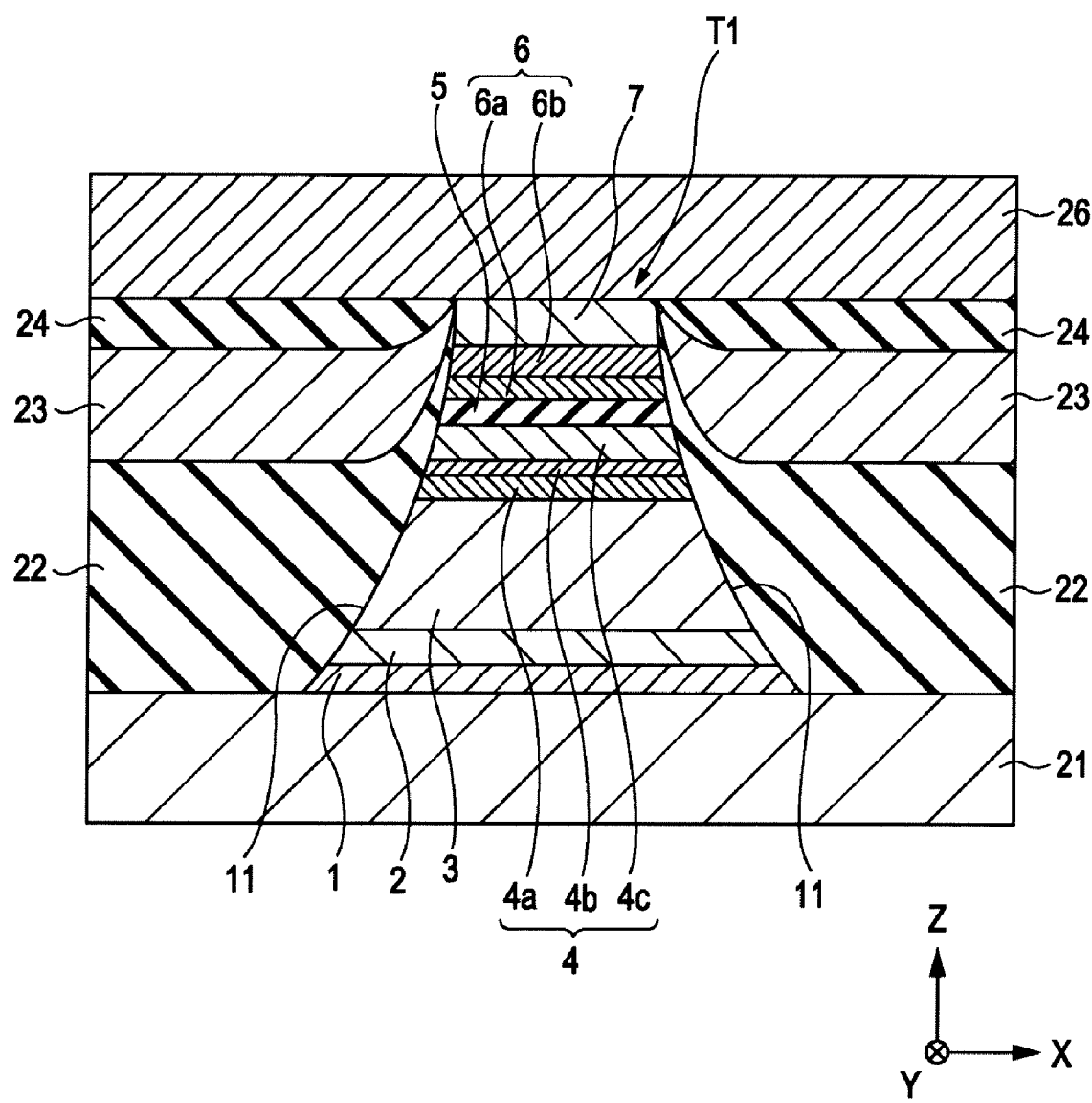
FIG. 1 is a cross-sectional view of a tunneling magnetic sensing element according to an embodiment, taken in the direction parallel to the face opposing a recording medium.

FIG. 1 is a cross-sectional view of a tunneling magnetic sensing element (tunnel magnetoresistance effect element) according to an embodiment, taken in the direction parallel to the face opposing a recording medium.

A tunneling magnetic sensing element is, for example, mounted on a hard disk at a trailing edge of a floating slider and detects a recording magnetic field of the hard disk. In the drawing, the X direction is the track width direction, the Y direction is the direction of leakage magnetic field from a magnetic recording medium (height direction), and the Z direction is the moving direction of the magnetic recording medium such as a hard disk and the lamination direction of each layer of the tunneling magnetic sensing element.

In FIG. 1, the bottom-most layer is a lower shielding layer 21 composed of, for example, a NiFe alloy. On the lower shielding layer 21, the above-mentioned laminate T1 is disposed. The tunneling magnetic sensing element is composed of the laminate T1, lower insulating barriers 22 disposed at both sides of the laminate T1 in the track width direction (the X direction in the drawing), a hard bias layer 23, and an upper insulating barrier 24.

The bottom most layer of the laminate T1 is a foundation layer 1 made of a non-magnetic material composed of any one or more elements such as Ta, Hf, Nb, Zr, Ti, Mo, and W. A seed layer 2 is disposed on this foundation layer 1. The seed layer 2 is composed of NiFeCr, for example. A seed layer 2 composed of NiFeCr has a face-centered cubic structure (fcc) in which an equivalent crystal plane represented as a {111} plane is preferentially oriented in the direction parallel to the film face. The laminate T1 may not have the foundation layer 1.

An antiferromagnetic layer 3 disposed on the seed layer 2 is preferably composed of an antiferromagnetic material containing an element α (α denotes any one or more elements selected from the group consisting of Pt, Pd, Ir, Rh, Ru, and Os) and Mn.

These α-Mn alloys containing elements of the platinum group are superior in corrosion resistance and have high blocking temperature. Furthermore, the exchange-coupling field (Hex) can be increased. Thus, the α-Mn alloys have excellent properties as antiferromagnetic materials.

The antiferromagnetic layer 3 may be composed of an antiferromagnetic material containing an element α, an element α', and Mn. The element α' denotes any one or more elements selected from the group of consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

A pinned magnetic layer 4 is disposed on the antiferromagnetic layer 3. The pinned magnetic layer 4 has a laminated ferri-structure composed of a lower magnetic layer 4a, a non-magnetic intermediate layer 4b, and an upper magnetic layer (a first magnetic layer) 4c which are laminated in this order from the bottom. The magnetization directions of the lower magnetic layer 4a and the upper magnetic layer 4c are in anti-parallel alignment due to an exchange-coupling field at the interface with the antiferromagnetic layer 3 and an antiferromagnetic exchange-coupling field (RKKY interaction) through the non-magnetic intermediate layer 4b. This is a so called laminated ferri-structure. With this structure, the magnetization of the pinned magnetic layer 4 can be stabilized, and the exchange-coupling field generated at the interface between the pinned magnetic layer 4 and the antiferromagnetic layer 3 can be apparently increased. The lower magnetic layer 4a and the upper magnetic layer 4c have a thickness of approximately 12 to 24 angstroms and the non-magnetic intermediate layer 4b has a thickness of approximately 8 to 10 angstroms, for example.

The lower magnetic layer 4a is composed of a ferromagnetic material such as CoFe, NiFe, or CoFeNi. The non-magnetic intermediate layer 4b is composed of a non-magnetic electrically conductive material such as Ru, Rh, Ir, Cr, Re, or Cu. The upper magnetic layer (first magnetic layer) 4c may be composed of a ferromagnetic material as in the lower magnetic layer 4a, but is preferably composed of CoFeB.

An insulating barrier 5 disposed on the pinned magnetic layer 4 is composed of Mg—O (magnesium oxide).

On the insulating barrier 5, a free magnetic layer 6 is disposed. The free magnetic layer 6 includes a soft-magnetic layer 6b composed of a magnetic material such as a NiFe alloy and an enhance layer (second magnetic layer) 6a composed of a CoFe alloy and disposed between the soft-magnetic layer 6b and the insulating barrier 5. The soft-magnetic layer 6b is preferably composed of a magnetic material excellent in soft-magnetic properties. The enhance layer 6a is composed of a magnetic material with a spin polarizability higher that of the soft-magnetic layer 6b. The resistance change ratio ($\Delta R/R$) can be improved by forming the enhance layer 6a with a CoFe alloy having a high spin polarizability.

The free magnetic layer 6 may have a laminated ferri-structure in which a plurality of magnetic layers is laminated having non-magnetic intermediate layers therebetween. The width size of the free magnetic layer 6 in the track width direction (the X direction in the drawing) determines the track width Tw.

A protective layer 7 composed of, for example, Ta is disposed.

Both end faces 11 of the laminate T1 in the track width direction (the X direction in the drawing) are inclined planes of which width sizes in the track width direction are gradually decreased from the bottom toward the top.

As shown in FIG. 1, the lower insulating barriers 22 are disposed from on the lower shielding layer 21 spreading at the both sides of the laminate T1 to on the end faces 11 of the laminate T1. On the lower insulating barriers 22, a hard bias layer 23 is disposed, and on the hard bias layer 23, an upper insulating barrier 24 is disposed.

Furthermore, a bias foundation layer (not shown) may be disposed between the lower insulating barriers 22 and the hard bias layer 23. The bias foundation layer is composed of Cr, W, or Ti, for example.

The insulating barriers 22 and 24 are composed of an insulating material such as $Al_2O_3$ or $SiO_2$. These insulating barriers insulate the top and the bottom of the hard bias layer 23 for preventing an electric current flowing in the laminate T1 in the direction perpendicular to the interface of each layer from distributing to the both sides in the track width direction of the laminate T1. The hard bias layer 23 is composed of, for example, a Co—Pt (cobalt-platinum) alloy or a Co—Cr—Pt (cobalt-chrome-platinum) alloy.

Furthermore, an upper shielding layer 26, which is composed of, for example, a NiFe alloy, is disposed on the laminate T1 and the upper insulating barrier 24.

In the embodiment shown in FIG. 1, the lower shielding layer 21 and the upper shielding layer 26 function as electrode layers for the laminate T1 so that an electric current flows in the direction (the direction parallel to the Z direction in the drawing) perpendicular to the film face of each layer of the laminate T1.

The free magnetic layer 6 is magnetized in the direction parallel to the track width direction (the X direction in the drawing) by a bias magnetic field from the hard bias layer 23. On the other hand, the lower magnetic layer 4a and the upper magnetic layer 4c constituting the pinned magnetic layer 4 are magnetized in the direction parallel to the height direction (the Y direction in the drawing). Since the pinned magnetic layer 4 has a laminated ferri-structure, the lower magnetic layer 4a and the upper magnetic layer 4c are magnetized in anti-parallel alignment. The magnetization of the pinned magnetic layer 4 is pinned (i.e., the magnetization is not varied by external magnetic fields), but the magnetization of the free magnetic layer 6 is varied by external magnetic fields.

When the upper magnetic layer 4c and the free magnetic layer 6 are magnetized in anti-parallel alignment, a change in the magnetization of the free magnetic layer 6 due to an external magnetic field reduces the tunnel current flowing through the insulating barrier 5 disposed between the upper magnetic layer 4c and the free magnetic layer 6 and the resistance value becomes the maximum. On the other hand, when the upper magnetic layer 4c and the free magnetic layer 6 are magnetized in parallel alignment, the tunnel current flows mostly and the resistance value becomes the minimum.

By using this phenomenon, an electric resistance change caused by a variation in magnetization of the free magnetic layer 6 which is caused by influence of external magnetic fields is detected as a voltage change, and a leakage magnetic field from a recording medium is detected.

The characteristic points of the embodiment shown in FIG. 1 will now be described.

In the embodiment shown in FIG. 1, the insulating barrier 5 is composed of Mg—O (magnesium oxide). The enhance layer (second magnetic layer) 6a constituting the free magnetic layer 6 is disposed on the insulating barrier 5. In this embodiment, the enhance layer (second magnetic layer) 6a is composed of $Co_{100-X}Fe_X$ having a Fe composition ratio X of about 30 to 100 at %.

Conventionally, in a tunneling magnetic sensing element having an Mg—O insulating barrier 5, the enhance layer 6a or the whole free magnetic layer 6 is composed of CoFeB (specifically, for example, $(Co_{0.5}Fe_{0.5})_{80at\%}B_{20at\%}$) in order to obtain a high resistance change ratio ($\Delta R/R$). However, such a case has disadvantage that the magnetostriction $\lambda$ of the free magnetic layer 6 is significantly increased.

In this embodiment, the magnetostriction $\lambda$ of the free magnetic layer 6 can be decreased by forming the enhance layer 6a with a CoFe alloy.

Furthermore, in this embodiment, the resistance change ratio ($\Delta R/R$) can be dramatically improved by forming the enhance layer 6a with the CoFe alloy having a Fe composition ratio X regulated to about 30 to 100 at %.

In this embodiment, a CoFe alloy having a Fe composition ratio X of about 50 to 90 at % can achieve a higher resistance change ratio ($\Delta R/R$) and is therefore preferred. Furthermore, a CoFe alloy having a Fe composition ratio X of about 70 to 90 at % can stably achieve a higher resistance change ratio ($\Delta R/R$) and is more preferred.

In a free magnetic layer 6 composed of enhance layer: $CoFe_{30-100}$ (thickness: 10 angstroms)/soft-magnetic layer: $Ni_{86at\%}Fe_{14at\%}$ (thickness: 60 angstroms), the magnetostriction $\lambda$ can be reduced to about 0.0 to 5.0 ppm. For reference, the magnetostriction $\lambda$ of a conventional free magnetic layer composed of an enhance layer: $(Co_{0.5}Fe_{0.5})_{80at\%}B_{20at\%}$ (thickness: 50 angstroms) is about 40 ppm.

In a free magnetic layer 6 composed of enhance layer: $(Co_{0.5}Fe_{0.5})_{80at\%}B_{20at\%}$(thickness: 10 angstroms)/soft-magnetic layer: $Ni_{86at\%}Fe_{14at\%}$ (thickness: 60 angstroms), the magnetostriction $\lambda$ is favorably low such as about 2 ppm. However, the resistance change ratio ($\Delta R/R$) is low such as about 35%. Thus, in the above-mentioned structure, a high resistance change ratio ($\Delta R/R$) which is expected by using an Mg—O insulating barrier 5 cannot be achieved.

In this embodiment, the Mg composition ratio of the Mg—O for the insulating barrier 5 is preferably within a range of about 40 to 60 at %, and $Mg_{50\ at\%}O_{50\ at\%}$ is most preferred.

Next, a preferred crystal structure of each layer will be described. It is preferred that the insulating barrier 5 has a body-centered cubic structure in which an equivalent crystal plane typically represented as a {100} plane is preferentially oriented in the direction parallel to the film face (the X-Y plane in the drawing). The term "crystal plane typically represented as a {100} plane" means a crystal lattice plane represented by a Miller index. The equivalent crystal planes represented as the {100} plane are a (100) plane, a (−100) plane, a (0-10) plane, a (010) plane, a (001) plane, and a (00-1) plane.

In this embodiment, a high resistance change ratio (ΔR/R) can be obtained by regulating the Mg—O insulating barrier 5 to have the above-described crystal structure. The crystal structure of the insulating barrier 5 is highly influenced by the crystal structure of the upper magnetic layer (first magnetic layer) 4c disposed on the bottom face of the insulating barrier 5.

In this embodiment, it is preferred that the upper magnetic layer (first magnetic layer) 4c has an amorphous structure. Thereby, the insulating barrier 5 formed on the upper magnetic layer 4c can be suitably formed in a body-centered cubic structure in which a {100} plane is preferentially oriented in the direction parallel to the film face.

The upper magnetic layer (first magnetic layer) 4c can be suitably formed in an amorphous structure and a high resistance change ratio (ΔR/R) can be obtained by forming the upper magnetic layer 4c with $(Co_{100-Y}Fe_Y)_ZB_{100-Z}$ having an atomic ratio Y of about 25 to 100 at % and an composition ratio Z of about 70 to 100 at %. The atomic ratio Y is determined as [at % of Fe/(at % of Co and at % of Fe)].

In the embodiment shown in FIG. 1, the seed layer 2 is formed in a face-centered cubic structure (fcc) in which a typical {111} plane is preferentially oriented in the direction parallel to the film face. The antiferromagnetic layer 3 and the pinned magnetic layer 4 disposed above the seed layer 2 are also readily formed in a face-centered cubic structure. For example, a CoFe-alloy upper magnetic layer (first magnetic layer) 4c is influenced by the layers disposed therebelow and readily has a face-centered cubic structure. As a result, a body-centered cubic structure cannot be appropriately formed in the insulating barrier 5.

On the other hand, as in this embodiment, the upper magnetic layer 4c having an amorphous structure can be properly formed by forming the upper magnetic layer 4c with CoFeB having a composition ratio of the above-mentioned range. Thereby, crystal growth in a face-centered cubic structure can be quit at the upper magnetic layer 4c and, therefore, the insulating barrier 5 can be appropriately formed in a body-centered cubic structure.

The thus obtained upper magnetic layer 4c having an amorphous structure may contain a face-centered cubic structure or a body-centered cubic structure.

In this embodiment, it is preferred that the enhance layer 6a has a body-centered cubic structure in which an equivalent crystal plane typically represented as a {100} plane is preferentially oriented in the direction parallel to the film face (the X-Y plane in the drawing). The crystal structure of the enhance layer 6a is also important to obtain a high resistance change ratio (ΔR/R). That is, in this embodiment, the enhance layer 6a is formed of CoFe having a Fe composition ratio X of about 30 to 100 at %, in order to obtain a high resistance change ratio (ΔR/R). The lattice constant mismatching between the insulating barrier 5 and the enhance layer 6a can be reduced by forming the enhance layer 6a in a body-centered cubic structure having a high Fe composition ratio X. The lattice constant of an Mg—O insulating barrier 5 is about 4.0 to 4.2 angstroms. The lattice constant of the enhance layer 6a is increased to near that of the insulating barrier 5 while the body-centered cubic structure is maintained by increasing the Fe composition ratio X of the enhance layer 6a. Consequently, the lattice constant mismatching between the insulating barrier 5 and the enhance layer 6a can be reduced. Thereby, the crystallinity and the orientation of the enhance layer 6a can be improved, and the resistance change ratio (ΔR/R) can be improved more effectively.

As described above, in this embodiment, the insulating barrier 5 and the enhance layer 6a have body-centered cubic structures, but may contain other structures such as amorphous structures.

The upper magnetic layer 4c having a thickness of 10 to 30 angstroms, the insulating barrier 5 having a thickness of 8 to 20 angstroms, and the enhance layer 6a having a thickness of 5 to 15 angstroms are preferred.

In this embodiment, the free magnetic layer 6 has a lamination structure composed of an enhance layer 6a and a NiFe-alloy soft-magnetic layer 6b. For example, the free magnetic layer 6 may be formed of a monolayer structure of the enhance layer 6a.

The free magnetic layer 6 having a lamination structure of the enhance layer 6a and the soft-magnetic layer 6b can reduce the magnetostriction λ and the coercive force Hc thereof and is thereby preferred. The Ni composition ratio of the NiFe alloy constituting the soft-magnetic layer 6b is preferably within a range of about 81.5 to 100 at %. In this embodiment, the soft-magnetic layer 6b has a thickness larger than that of the enhance layer 6a. Specifically, the soft-magnetic layer 6b preferably has a thickness within the range of 30 to 80 angstroms.

In the tunneling magnetic sensing element having an Mg—O insulating barrier according to this embodiment, a high resistance change ratio (ΔR/R) can be obtained while favorable soft-magnetic properties of the free magnetic layer 6 are maintained. Furthermore, the RA (element resistance R×element area A) can be adjusted to a low value approximately the same as that of conventional one.

The RA value is very important, for example, in optimization for high-speed data transmission and is required to be low. Specifically, the RA can be adjusted within a range of 2 to 20 $\Omega\mu m^2$, preferably 2 to 15 $\Omega\mu m^2$, more preferably 2 to 10 $\Omega\mu m^2$, more preferably 2 to 5 $\Omega\mu m^2$, and most preferably 2 to 3 $\Omega\mu m^2$.

As shown in the experiments below, the resistance change ratio (ΔR/R) is reduced with decreasing RA value. Therefore, even if the RA value is a little high, the resistance change ratio (ΔR/R) can be stably adjusted to a high value by adjusting the RA value in the range of about 5 to 15 $\Omega\mu m^2$ which is a range that can maintain a higher resistance change ratio (ΔR/R).

A method of manufacturing the tunneling magnetic sensing element of this embodiment will be described. FIGS. 2 to 5 are partial cross-sectional views of a tunneling magnetic sensing element during manufacturing processes, taken in the same direction as shown in FIG. 1.

Figure 2:
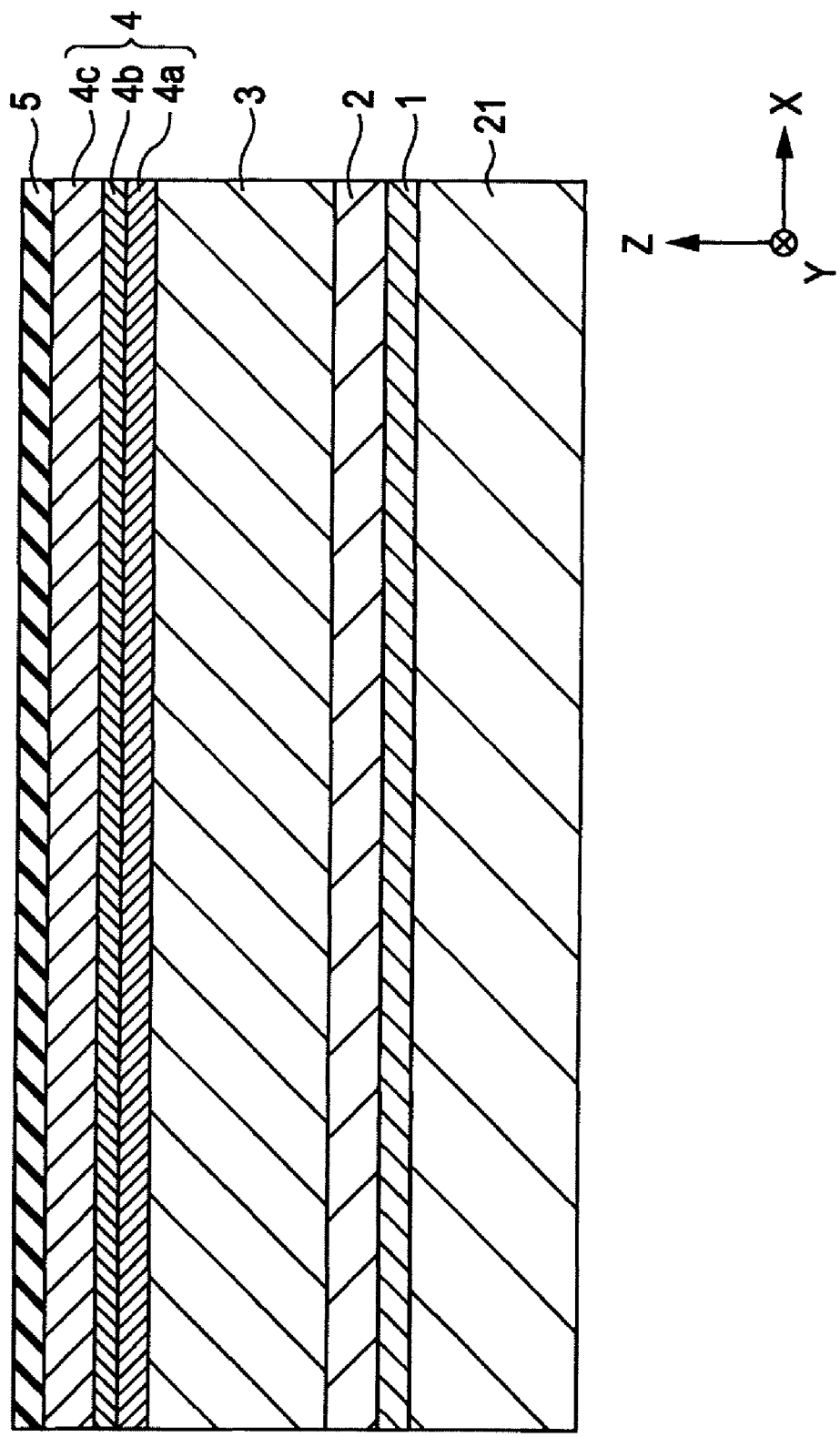
FIG. 2 is a process drawing illustrating a manufacturing step of a tunneling magnetic sensing element according to an embodiment of the present invention (a cross-sectional view of the tunneling magnetic sensing element during the manufacturing process, taken in the direction parallel to the face opposing a recording medium)

In the process shown in FIG. 2, a foundation layer 1, a seed layer 2, an antiferromagnetic layer 3, a lower magnetic layer 4a, a non-magnetic intermediate layer 4b, and a upper magnetic layer (first magnetic layer) 4c are continuously formed on a lower shielding layer 21.

In this embodiment, it is preferred that the upper magnetic layer 4c is formed of $(Co_{100-Y}Fe_Y)_ZB_{100-Z}$ having an atomic ratio Y of about 25 to 100 at % and a composition ratio Z of about 75 to 100 at %. The upper magnetic layer 4c preferably has a thickness of 10 to 30 angstroms.

Then, an Mg—O insulating barrier 5 is formed on the upper magnetic layer 4c. In this embodiment, the insulating barrier 5 may be formed by sputtering an insulating barrier composed of Mg—O on the upper magnetic layer 4c using an Mg—O target with a predetermined composition ratio or may be formed by sputtering an Mg layer on the upper magnetic layer 4c and then oxidizing the Mg layer.

In this embodiment, it is preferred to form the insulating barrier 5 using an Mg—O target. Thereby, the insulating barrier 5 can be properly formed in a body-centered cubic structure in which a crystal plane typically represented as a {100} plane is preferentially oriented in the direction parallel to the film face.

The Mg composition ratio of Mg—O is preferably about 40 to 60 at %, and $Mg_{50\ at\%}O_{50\ at\%}$ is most preferred. In this embodiment, the insulating barrier 5 preferably has a thickness of 8 to 20 angstroms.

Figure 3:
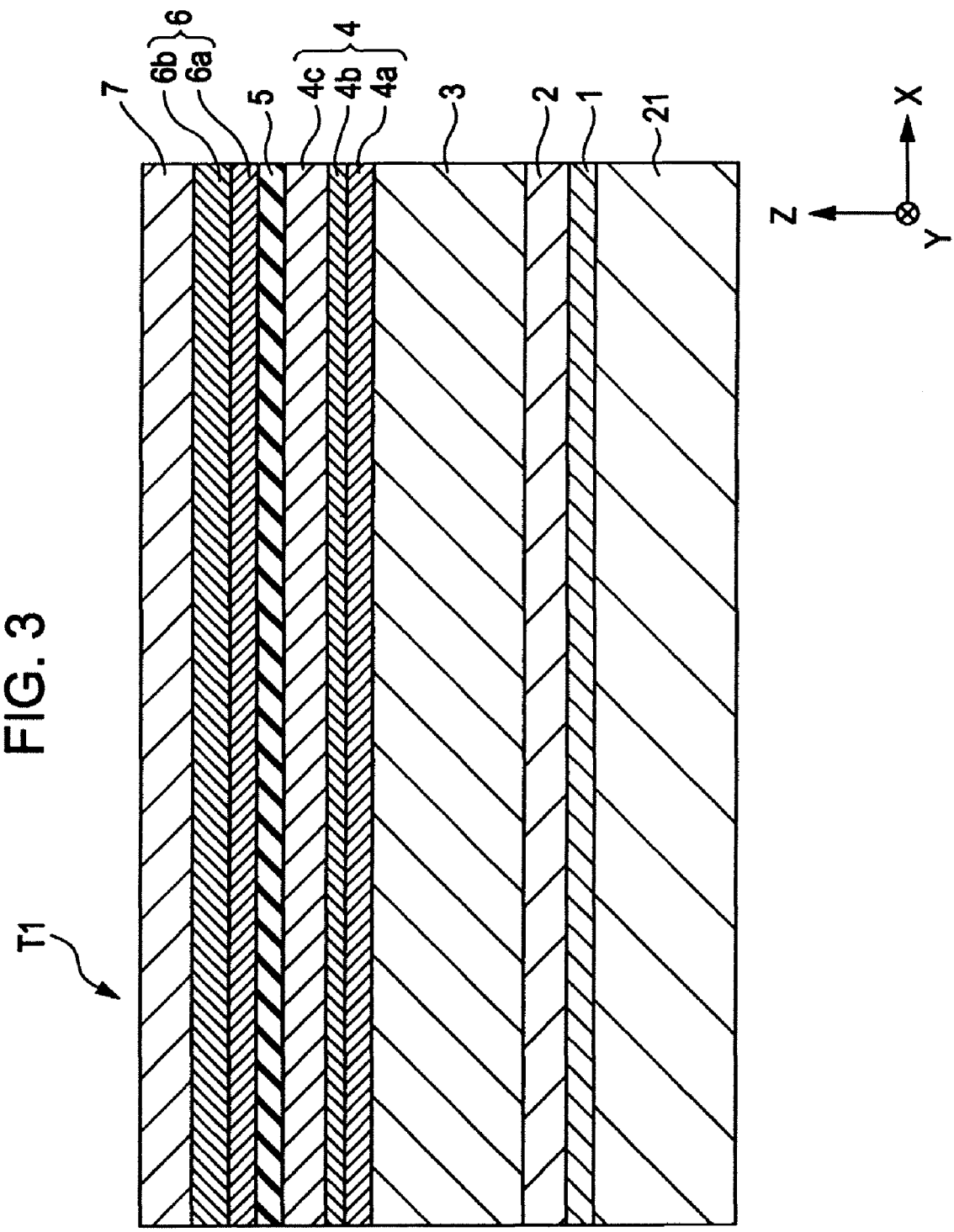
FIG. 3 is a process drawing illustrating the step performed after the step shown in FIG. 2 (a cross-sectional view of the tunneling magnetic sensing element during the manufacturing process, taken in the direction parallel to the face opposing a recording medium)

Then, in the process shown in FIG. 3, a free magnetic layer 6 composed of an enhance layer (second magnetic layer) 6a and a soft-magnetic layer 6b and a protective layer 7 are formed on the insulating barrier 5.

In this embodiment, the enhance layer (second magnetic layer) 6a is made of $Co_{100-X}Fe_X$ having a Fe composition ratio X of about 30 to 100 at %. The soft-magnetic layer 6b is preferably formed of a NiFe alloy having a Ni composition ratio of about 81.5 to 100 at %.

Thus, a laminate T1 consisting of from the foundation layer 1 to the protective layer 7 laminated is formed.

Then, on the laminate T1, a resist layer 30 for lift off is formed. The both sides of the laminate T1 in the track width direction (the X direction in the drawing) not being covered with the resist layer 30 for lift off are removed, for example, by etching (refer to FIG. 4).

Figure 5:
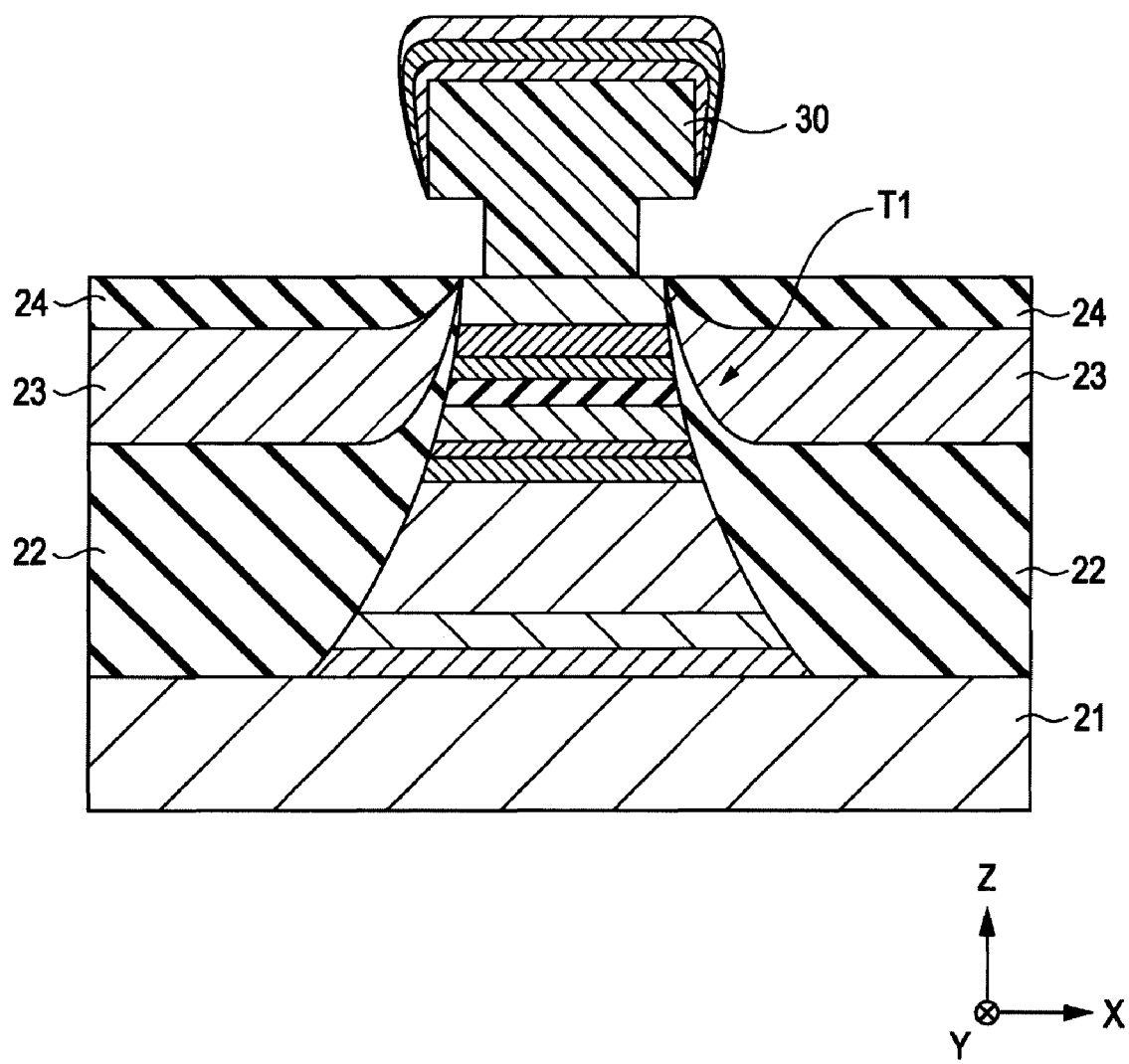
FIG. 5 is a process drawing illustrating the step performed after the step shown in FIG. 4 (a cross-sectional view of the tunneling magnetic sensing element during the manufacturing process, taken in the direction parallel to the face opposing a recording medium)

Then, a lower insulating barrier 22, a hard bias layer 23, and a upper insulating barrier 24 are deposited on the lower shielding layer 21 in this order from the bottom at the both sides of the laminate T1 in the track width direction (the X direction in the drawing) (refer to FIG. 5).

The resist layer 30 for lift off is removed, and then an upper shielding layer 26 is formed on the laminate T1 and the upper insulating barrier 24.

The method of manufacturing the tunneling magnetic sensing element includes a process for annealing. Typically, an exchange-coupling field (Hex) is generated between the antiferromagnetic layer 3 and the lower magnetic layer 4a by annealing. The annealing is preferably performed at 270 to 310° C for 1 to 10 hours.

In the method of manufacturing the tunneling magnetic sensing element in this embodiment, an insulating barrier 5 is formed of Mg—O, and, on the insulating barrier 5, an enhance layer (second magnetic layer) 6a is formed of $Co_{100-X}Fe_X$ having a Fe composition ratio X of about 30 to 100 at %. Thereby, the magnetostriction λ of the free magnetic layer 6 can be reduced and a tunneling magnetic sensing element which can have a further higher resistance change ratio (ΔR/R) can be simply and suitably manufactured.

In this embodiment, an upper magnetic layer (first magnetic layer) 4c made of $(Co_{100-Y}Fe_Y)_ZB_{100-Z}$ with an atomic ratio Y of about 25 to 100 at % and a composition ratio Z of about 70 to 100 at % is preferred in order to obtain a high resistance change ratio (ΔR/R). Furthermore, a free magnetic layer 6 having a lamination structure of an enhance layer 6a and a soft-magnetic layer 6b made of a NiFe-alloy with a Ni composition ratio of about 81.5 to 100 at % can have a reduced magnetostriction λ and a coercive force Hc and can have favorable soft-magnetic properties and is therefore preferred.

In this embodiment, the insulating barrier 5 and the upper magnetic layer 4c are in direct contact with each other, but may have, for example, an Mg layer therebetween.

Even if an Mg layer lies between the insulating barrier 5 and the pinned magnetic layer 4, a high resistance change ratio (ΔR/R) can be obtained at a region with a low RA, like a case without the Mg layer.

The tunneling magnetic sensing element according to this embodiment can be not only used in a hard disk but also used as an MRAM (Magnetic Random Access Memory), for example.

EXAMPLE

A tunneling magnetic sensing element shown in FIG. 1 was produced.

A laminate T1 was formed by laminating, from the bottom, foundation layer 1; Ta(30)/seed layer 2; NiFeCr(50)/antiferromagnetic layer 3; IrMn(70)/pinned magnetic layer 4 [lower magnetic layer 4a; $Co_{70at\%}Fe_{30at\%}$(14)/non-magnetic intermediate layer 4b; Ru(9,1)/upper magnetic layer 4c; $Co_{40at\%}Fe_{40at\%}B_{20at\%}$(18)]/Mg(4)/insulating barrier 5; Mg—O/free magnetic layer 6 [enhance layer 6a; $Co_{100-X}Fe_X$(10)/soft-magnetic layer; $Ni_{86at\%}Fe_{14at\%}$(40)]/protective layer 7; Ta(200). The numerals within parentheses show average film thicknesses and the unit thereof is angstrom.

The insulating barrier 5 composed of Mg—O was formed by sputtering using an Mg—O target (the composition ratio is 50:50 at %). The thickness of the insulating barrier 5 in each sample was 9 to 15 angstroms.

The above-obtained basic layers were heated to 240 to 300° C. for 4 hours.

Figure 9:
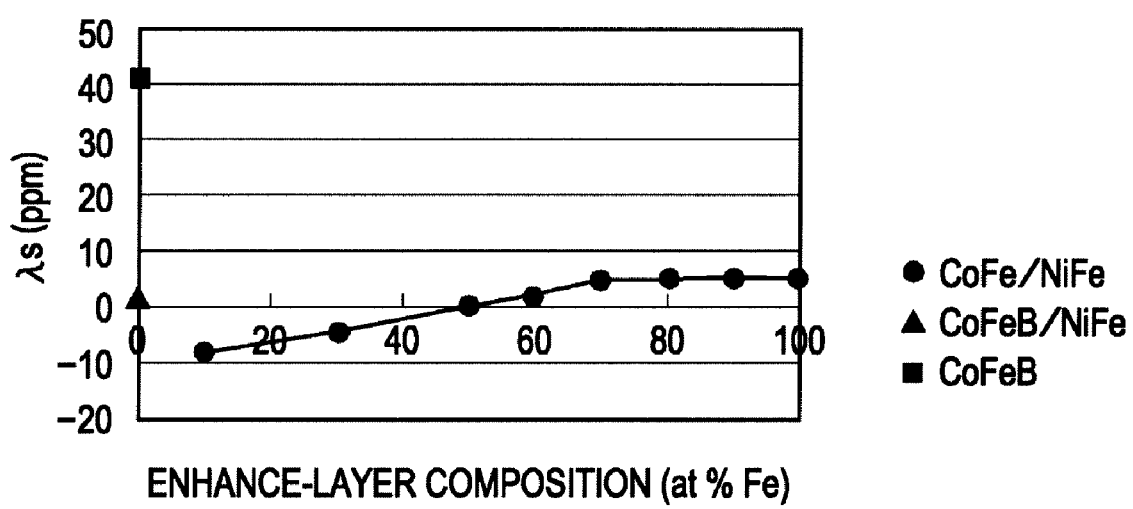
FIG. 9 is a graph showing a relationship between the Fe composition ratio X of the enhance layer and the magnetostriction of the free magnetic layer in each tunneling magnetic sensing element used in the experiment of FIG. 6, and the magnetostriction of the free magnetic layer of the tunneling magnetic sensing element when the free magnetic layer has a monolayer structure composed of $(Co_{0.5}Fe_{0.5})_{80at\%}B_{20at\%}$) or is composed of an enhance layer: $(Co_{0.5}Fe_{0.5})_{80at\%}B_{20at\%}$/soft magnetic layer: $Ni_{86at\%}Fe_{14at\%}$.

In this Experiment, a relationship between the Fe composition ratio X and the resistance change ratio (ΔR/R) and a relationship between the Fe composition ratio and the magnetostriction λ of the free magnetic layer were investigated by changing the Fe composition ratio X of CoFe constituting the enhance layer 6a. The results are shown in FIGS. 6 and 9.

Figure 6:
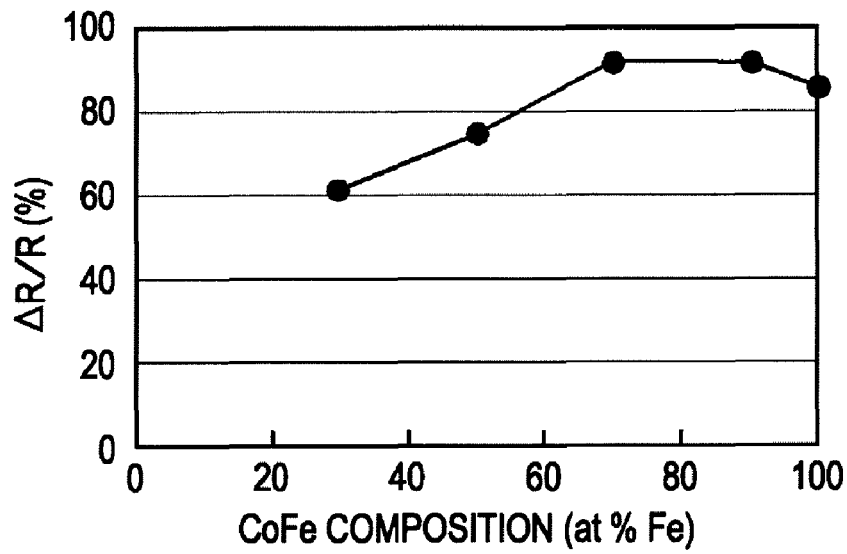
FIG. 6 is a graph showing a relationship between the Fe composition ratio X of a CoFe enhance layer and the resistance change ratio ($\Delta R/R$) in a tunneling magnetic sensing element having an Mg—O insulating barrier and the CoFe enhance layer disposed on the insulating barrier.

As shown in FIG. 6, the resistance change ratio (ΔR/R) increases with the Fe composition ratio X. As shown in FIG. 9, the magnetostriction λ of the free magnetic layer 6 is within a range of −5 to 5 ppm and can be kept at low values.

Figure 7:
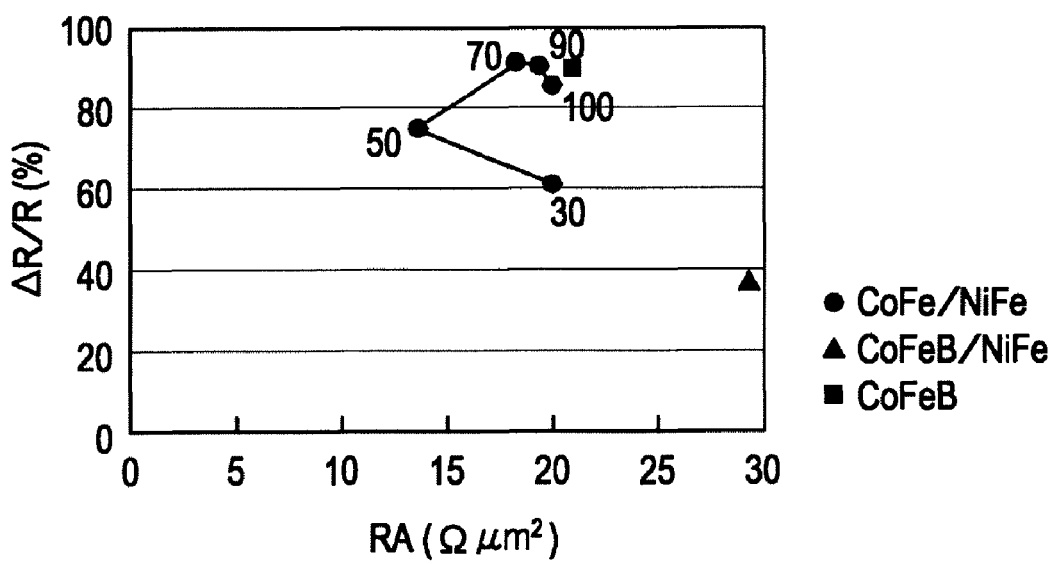
FIG. 7 is a graph showing a relationship between the RA and the resistance change ratio ($\Delta R/R$) with respect to the Fe composition ratio X of the enhance layer in each tunneling magnetic sensing element used in the experiment of FIG. 6, and a relationship between the RA and the resistance change ratio ($\Delta R/R$) of a tunneling magnetic sensing element having a free magnetic layer of a monolayer structure composed of $(Co_{0.5}Fe_{0.5})_{80at\%}B_{20at\%}$) or having a free magnetic layer composed of an enhance layer: $(Co_{0.5}Fe_{0.5})_{80at\%}B_{20at\%}$/soft magnetic layer: $Ni_{86at\%}Fe_{14at\%}$.

FIG. 7 is experimental results showing a relationship between the RA and the resistance change ratio (ΔR/R) in each sample used in the experiment shown in FIG. 6. The numerals in the graph denote the Fe composition ratios of the enhance layers 6a of the samples. It is important that the RA value is low as far as possible for achieving a high recording density. The RA values shown in FIG. 7 were within a range of about 15 to 25 Ωμm².

Figure 8:
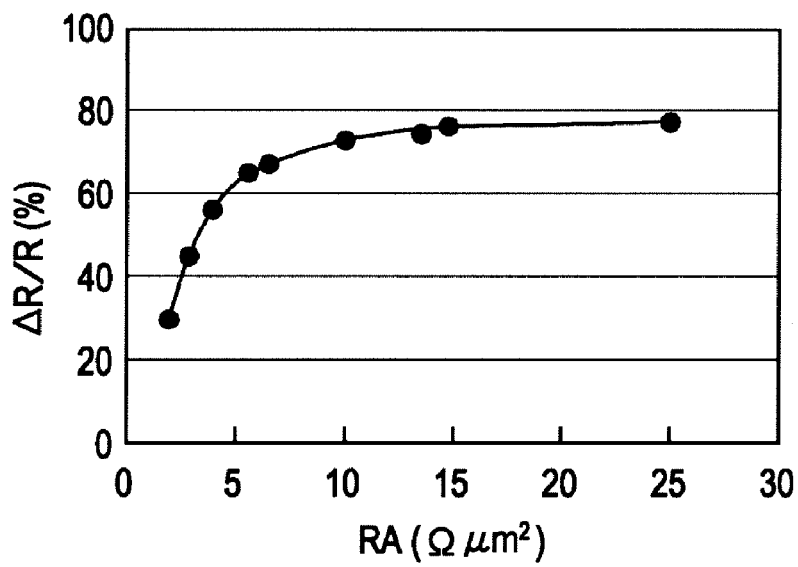
FIG. 8 is a graph showing a relationship between the RA and the resistance change ratio ($\Delta R/R$) when the enhance layer of the tunneling magnetic sensing element used in the experiment shown in FIG. 6 is fixed to $Co_{50at\%}Fe_{50at\%}$ and the thickness of the insulating barrier is changed.

Then, in this experiment, a relationship between the RA and the resistance change ratio (ΔR/R) was investigated using the above-described basic layers including the enhance layer 6a fixed to $Co_{50at\%}Fe_{50at\%}$ and changing the thickness of the insulating barrier 5 in the range of 9 to 15 angstroms of each sample. FIG. 8 shows the results.

As shown in FIG. 8, the resistance change ratio (ΔR/R) is decreased with the RA. The RA can be reduced by reducing the thickness of the insulating barrier 5.

As shown in FIG. 8, in this Example, a resistance change ratio (ΔR/R) of 30% or more can be achieved even if the RA is decreased to about 2 Ωμm². As described above, it is desired that the RA be low as far as possible. As shown in FIG. 8, the RA can be adjusted within a range of 2 to 20 Ωμm², preferably 2 to 15 Ωμm², more preferably 2 to 10 Ωμm², more preferably 2 to 5 Ωμm², and most preferably 2 to 3 Ωμm².

However, as shown in FIG. 8, the resistance change ratio (ΔR/R) is sharply decreased when the Ra is smaller than 5 Ωμm². Therefore, the resistance change ratio (ΔR/R) can be stably adjusted at a high value by adjusting the RA within a range of about 5 to 15 Ωμm². This is advantageous.

FIG. 8 shows only the results when the Fe composition ratio X of the enhance layer 6a was fixed to 50 at %, but it is assumed that even when the Fe composition ratio X was 30, 70, 90, or 100 at % shown in FIG. 7, each resistance change ratio (ΔR/R) with respect to the RA may be different, but will show the similar RA dependency to that shown in FIG. 8 (for example, in a comparison of Fe composition ratios of 100 at % and 30 at % in FIG. 7, the RA values are approximately the same, but the resistance change ratios (ΔR/R) are different from each other).

In this Example, on the basis of the experimental results shown in FIGS. 6 to 8, the Fe composition ratio of CoFe constituting the enhance layer 6a is determined to about 30 to 100 at %, preferably about 50 to 90 at %, and more preferably about 70 to 90 at %.

As shown in FIGS. 7 and 9, the experiments were conducted for a free magnetic layer having a monolayer structure of $(Co_{0.5}Fe_{0.5})_{80at\%}B_{20at\%}$ (thickness: 50 angstroms) and a free magnetic layer composed of enhance layer: $(Co_{0.5}Fe_{0.5})_{80at\%}B_{20at\%}$ (thickness: 10 angstroms)/soft-magnetic layer: $Ni_{86at\%}Fe_{14at\%}$ (thickness: 60 angstroms).

In the monolayer structure of $(Co_{0.5}Fe_{0.5})_{80at\%}B_{20at\%}$ (thickness: 50 angstroms), though a high resistance change ratio (ΔR/R) can be achieved, the magnetostriction of the free magnetic layer is increased to about 40 ppm.

On the other hand, in the free magnetic layer of $(Co_{0.5}Fe_{0.5})_{80at\%}B_{20at\%}/Ni_{86at\%}Fe_{14\,at\%}$, though the magnetostriction of the free magnetic layer can be reduced, the resistance change ratio (ΔR/R) is also decreased.

What is claimed is:

1. A tunneling magnetic sensing element comprising:
   a first magnetic layer, an insulating barrier disposed over the first magnetic layer, and a second magnetic layer disposed over the insulating barrier;
   wherein the first magnetic layer constitutes at least a part of a pinned magnetic layer having a pinned magnetization direction;
   wherein the second magnetic layer constitutes at least a part of a free magnetic layer having a magnetization direction being changed by an external magnetic field;
   wherein the insulating barrier is composed of Mg—O;
   wherein the second magnetic layer is composed of $Co_{100-x}Fe_x$ having a Fe composition ratio X of about 50 at % to 90 at %,
   wherein the insulating barrier has a body-centered cubic structure in which an equivalent crystal plane typically represented as a {100} plane is preferentially oriented in the direction parallel to the interface,
   wherein the second magnetic layer has a body-centered cubic structure in which an equivalent crystal plane typically represented as a {100} plane is preferentially oriented in the direction parallel to the interface,
   wherein the first magnetic layer has an amorphous structure,
   wherein the first magnetic layer is composed of $(Co_{100-Y}Fe_Y)_ZB_{100-Z}$, the atomic ratio Y is about 25 to 100 at %, and the composition ratio Z is about 70 to 100 at %,
   wherein the second magnetic layer is an enhance layer, and the free magnetic layer contains the enhance layer and a soft-magnetic layer which is composed of a NiFe-alloy and is disposed on the enhance layer, the Ni composition ratio in the NiFe-alloy is 81.5% to 100%, and
   wherein the second magnetic layer is directly in contact with the insulating barrier, the soft-magnetic layer is directly in contact with the second magnetic layer.

2. The tunneling magnetic sensing element according to claim 1, wherein the insulating barrier has a thickness between 8 to 20 angstroms.

3. The tunneling magnetic sensing element according to claim 1, wherein the second magnetic layer has a thickness between 5 to 15 angstroms.

4. The tunneling magnetic sensing element according to claim 1, wherein the soft magnetic layer has a thickness between 30 to 80 angstroms.

* * * * *